(12) United States Patent
Huang et al.

(10) Patent No.: US 9,716,361 B2
(45) Date of Patent: Jul. 25, 2017

(54) MEMORY MODULE ADAPTOR CARD

(71) Applicant: Intel Corporation, Santa Clara, CA (US)

(72) Inventors: Shaowu Huang, Steilacoom, WA (US); Beom-Taek Lee, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/291,993

(22) Filed: Oct. 12, 2016

(65) Prior Publication Data

US 2017/0063013 A1 Mar. 2, 2017

Related U.S. Application Data

(63) Continuation of application No. 14/746,411, filed on Jun. 22, 2015, now Pat. No. 9,496,633.

(51) Int. Cl.
| | |
|---|---|
| *H01R 33/92* | (2006.01) |
| *G06F 1/18* | (2006.01) |
| *H01R 12/73* | (2011.01) |
| *H05K 1/14* | (2006.01) |
| *H05K 7/14* | (2006.01) |
| *H01R 25/00* | (2006.01) |
| *G11C 5/04* | (2006.01) |

(52) U.S. Cl.
CPC ............. *H01R 33/92* (2013.01); *G06F 1/185* (2013.01); *H01R 12/737* (2013.01); *H01R 25/00* (2013.01); *H05K 1/14* (2013.01); *H05K 7/1422* (2013.01); *G11C 5/04* (2013.01)

(58) Field of Classification Search
CPC ..................................................... H01R 33/92
See application file for complete search history.

(56) References Cited

U.S. PATENT DOCUMENTS

| | | | |
|---|---|---|---|
| 5,211,565 | A | 5/1993 | Krajewski et al. |
| 5,754,796 | A | 5/1998 | Wang et al. |
| 5,926,378 | A | 7/1999 | DeWitt et al. |
| 5,963,464 | A | 10/1999 | Dell et al. |
| 6,046,912 | A | 4/2000 | Leman |
| 6,109,929 | A | 8/2000 | Jasper |
| 6,147,871 | A | 11/2000 | DeWitt et al. |
| 6,178,526 | B1 * | 1/2001 | Nguyen ................ G01R 31/01 714/42 |
| 6,202,110 | B1 | 3/2001 | Coteus et al. |
| 6,297,957 | B1 * | 10/2001 | Johnson ................ G06F 1/182 361/679.46 |

(Continued)

OTHER PUBLICATIONS

Tomotaka Miyashiro et al., "DIMMNET-2: A Reconfigurabel Board Connected Into a Memory Slot", 2006, 4 pages, IEEE.

(Continued)

*Primary Examiner* — Ross Gushi
(74) *Attorney, Agent, or Firm* — Schwabe, Williamson & Wyatt, P.C.

(57) ABSTRACT

Apparatuses and processes associated with a dual in-line memory module (DIMM) adaptor card. Specifically, the DIMM adaptor card may be configured to removeably couple with a slot of a printed circuit board (PCB). The DIMM adaptor card may further be configured to removeably couple with a first DIMM and a second DIMM. Other embodiments may be described and/or claimed.

14 Claims, 8 Drawing Sheets

(56) References Cited

U.S. PATENT DOCUMENTS

| | | |
|---|---|---|
| 6,324,071 B2 | 11/2001 | Weber et al. |
| 6,362,974 B1 | 3/2002 | Lettang |
| 6,363,450 B1 | 3/2002 | Lash et al. |
| 6,392,142 B1 | 5/2002 | Uzuka et al. |
| 6,416,333 B1 | 7/2002 | Hasegawa et al. |
| 6,418,034 B1 | 7/2002 | Weber et al. |
| 6,542,373 B1 | 4/2003 | Oba |
| 6,692,293 B2 | 2/2004 | MacLaren et al. |
| 6,731,515 B2 | 5/2004 | Rhoads |
| 6,976,848 B2 | 12/2005 | Choi |
| 7,009,848 B2 | 3/2006 | Ruckerbauer et al. |
| 7,044,770 B2 | 5/2006 | MacLaren et al. |
| 7,045,891 B2 | 5/2006 | Choi |
| 7,072,201 B2 | 7/2006 | So et al. |
| 7,075,797 B1 | 7/2006 | Leonard et al. |
| 7,193,861 B2 | 3/2007 | Uzuka et al. |
| 7,200,023 B2 | 4/2007 | Foster, Sr. |
| 7,272,017 B2 | 9/2007 | Kwatra et al. |
| 7,280,373 B2 | 10/2007 | Aizawa |
| 7,298,625 B1 | 11/2007 | Wu et al. |
| 7,351,072 B2 | 4/2008 | Muff et al. |
| 7,359,216 B2 | 4/2008 | Hall |
| 7,359,257 B2 | 4/2008 | RaghuRam |
| 7,365,990 B2 | 4/2008 | RaghuRam |
| 7,468,884 B2 | 12/2008 | Carr et al. |
| 7,566,227 B2 | 7/2009 | Li |
| 7,613,011 B2 | 11/2009 | Grundy et al. |
| 7,715,200 B2 | 5/2010 | Cho et al. |
| 7,803,020 B2 | 9/2010 | Crane, Jr. et al. |
| 7,848,115 B2 | 12/2010 | Casto et al. |
| 7,996,602 B1 | 8/2011 | Warnes et al. |
| 8,092,233 B1 | 1/2012 | Lee et al. |
| 8,102,671 B2 | 1/2012 | Goldstein et al. |
| RE43,162 E | 2/2012 | RaghuRam |
| 8,131,903 B2 | 3/2012 | Pearson et al. |
| 8,199,515 B2 | 6/2012 | Bandholz et al. |
| 8,277,229 B2 | 10/2012 | Chiu et al. |
| 8,432,707 B2 | 4/2013 | Pairault |
| 8,488,326 B2 | 7/2013 | Nguyen |
| 8,537,563 B2 | 9/2013 | Purcell et al. |
| 8,585,442 B2 | 11/2013 | Tuma et al. |
| 8,873,249 B2 | 10/2014 | Bandholz et al. |
| 8,995,143 B2 * | 3/2015 | Lin .................. G06F 1/185 361/755 |
| 9,110,640 B2 * | 8/2015 | Lin .................. G06F 1/183 |
| 9,148,974 B2 | 9/2015 | Goldstein et al. |
| 9,155,194 B1 | 10/2015 | Sullivan et al. |
| 9,223,358 B2 * | 12/2015 | Lin .................. G06F 1/185 |
| 9,229,747 B2 | 1/2016 | Berke et al. |
| 9,250,648 B2 * | 2/2016 | Shih .................. G06F 1/185 |
| 9,298,228 B1 | 3/2016 | Abhyankar |
| 9,496,633 B1 * | 11/2016 | Huang .................. G06F 1/185 |
| 9,575,519 B2 * | 2/2017 | Yin .................. G06F 1/185 |
| 2002/0034068 A1 | 3/2002 | Weber et al. |
| 2002/0142660 A1 | 10/2002 | Abe |
| 2003/0003778 A1 | 1/2003 | Huang |
| 2003/0049948 A1 | 3/2003 | Kim et al. |
| 2003/0107365 A1 | 6/2003 | Brunelle et al. |
| 2003/0137862 A1 | 7/2003 | Brunelle et al. |
| 2004/0085795 A1 | 5/2004 | Braun et al. |
| 2005/0044302 A1 | 2/2005 | Pauley et al. |
| 2005/0270298 A1 * | 12/2005 | Thieret .................. G06F 13/409 345/502 |
| 2006/0050496 A1 | 3/2006 | Goodwin |
| 2007/0015381 A1 | 1/2007 | Muff et al. |
| 2008/0002370 A1 | 1/2008 | Lau et al. |
| 2008/0052462 A1 | 2/2008 | Blakely et al. |
| 2008/0266777 A1 * | 10/2008 | Goldstein .............. H05K 7/1431 361/679.32 |
| 2008/0270649 A1 | 10/2008 | Pearson et al. |
| 2009/0080164 A1 * | 3/2009 | Purcell .................. H05K 1/148 361/737 |
| 2010/0035461 A1 | 2/2010 | Berke |
| 2010/0323536 A1 | 12/2010 | Crane, Jr. et al. |
| 2011/0149499 A1 | 6/2011 | Bandholz et al. |
| 2011/0318964 A1 | 12/2011 | Pairault |
| 2012/0331219 A1 | 12/2012 | Cai |
| 2014/0065881 A1 | 3/2014 | Vinay et al. |
| 2014/0133085 A1 | 5/2014 | Lin et al. |
| 2015/0181746 A1 | 6/2015 | Mullen et al. |
| 2015/0349440 A1 | 12/2015 | Seok et al. |
| 2015/0373855 A1 | 12/2015 | Goldstein et al. |

OTHER PUBLICATIONS

Patentability Search Report—Novel Scalable DDR Memory topologies with reconfigurable module adaptor—11978, Apr. 2, 2015, 14 pages, www.evalueserve.com, 2015.

Office Action issued Apr. 5, 2016 from U.S. Appl. No. 14/746,411, 13 pages.

Notice of Allowance issued Jul. 21, 2016 from U.S Appl. No. 14/746,411, 12 pages.

* cited by examiner

MEMORY MODULE ADAPTOR CARD

RELATED APPLICATION

This application is a continuation application of U.S. patent application Ser. No. 14/746,411, entitled "MEMORY MODULE ADAPTOR CARD," filed Jun. 22, 2015, and claims priority to said Application, which Specification is hereby fully incorporated by reference.

TECHNICAL FIELD

The present disclosure relates to the field of adaptor cards, and more particularly to adaptor cards for memory in computing devices.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

In computing devices, a printed circuit board (PCB) may have a plurality of slots to receive a dual in-line memory module (DIMM). Generally, each DIMM may run at a relatively high number of transfers per second when the slots are fully populated. However, in some cases one or more slots may be populated by a DIMM, and another one or more slots may be empty. In this case, the empty slot may affect the DIMM in the populated slot, causing it to run at a significantly reduced number of transfers per second.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
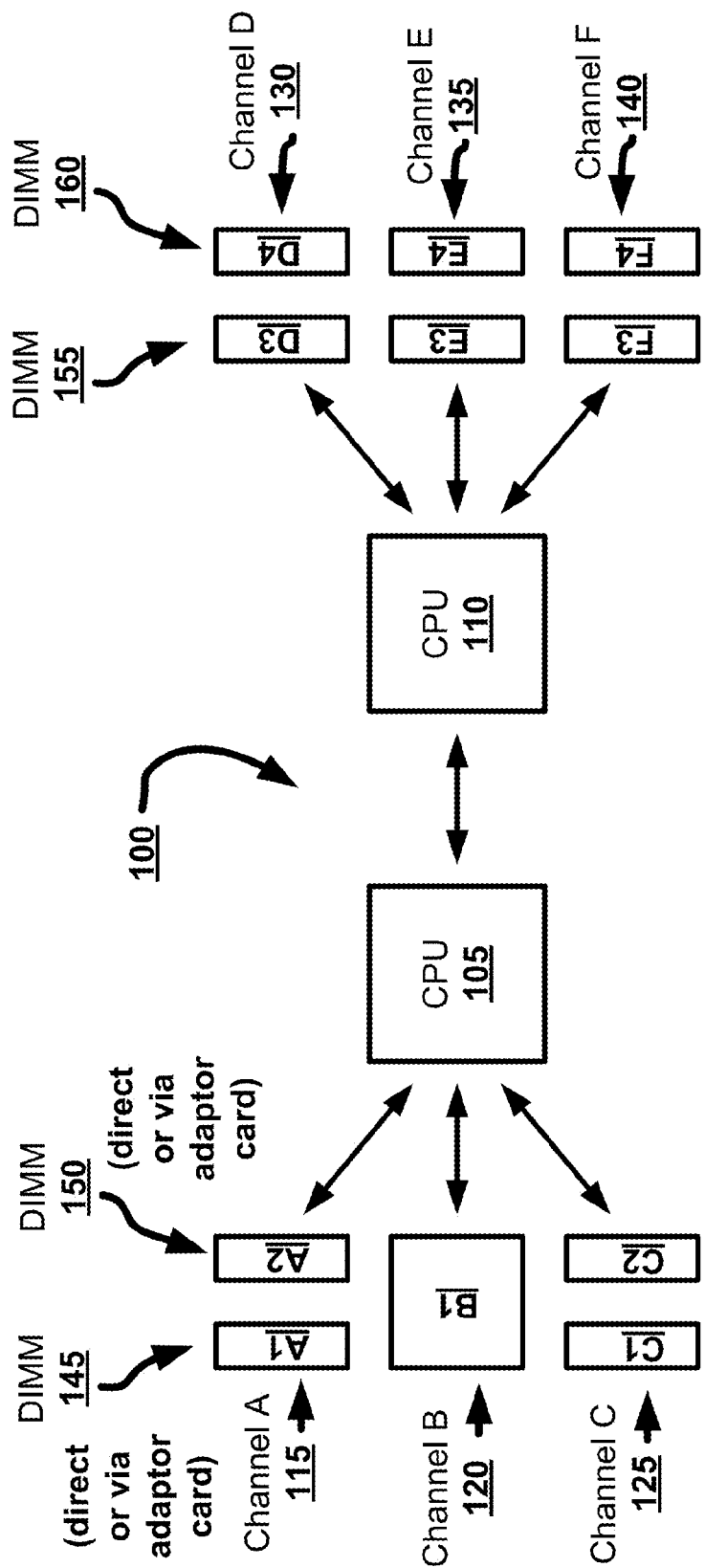
FIG. 1 illustrates an example computer system suitable for use with a DIMM adaptor card of the present disclosure, in accordance with various embodiments.

Embodiments herein relate to apparatuses and processes associated with a dual in-line memory module (DIMM) adaptor card comprising. Specifically, the DIMM adaptor card may be configured to removeably couple with a slot of a printed circuit board (PCB). The DIMM adaptor card may further be configured to removeably coupled with a first DIMM and a second DIMM. Other embodiments may be described and/or claimed. In some embodiments, the slot may be the only slot of a logical channel of the PCB. In some embodiments, the DIMM adaptor card may be removed and replaced by a different DIMM adaptor card configured to couple with a single DIMM, or more than two DIMMs.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, a DIMM may refer to a dual data rate (DDR) DIMM, a DDR2 DIMM, a DDR3 DIMM, a DDR4 DIMM, or some other type of DIMM. A DIMM may have some number of pins such as 72 pins, 100, pins, 144 pins, etc.

FIG. 1 illustrates an example system 100 suitable for use with a DIMM adaptor card of the present disclosure, in accordance with various embodiments. The system 100 may include one or more CPUs such as CPUs 105 and 110. The CPUs 105 and 110 may be configured to communicate with one another, as indicated by the line with arrows.

In some embodiments, each CPU 105 and 110 may have one or more logical channels, which may be also referred to as DDR channels. For example, CPU 105 may have logical channels such as channel A 115, channel B 120, and channel C 125. CPU 110 may have logical channels such as channel D 130, channel E 135, and channel F 140. In embodiments, each channel 115, 120, 125, 130, 135, and 140 may have one or more physical slots to couple with a DIMM such as DIMMs 145, 150, 155, and/or 160. For example, channel A 115 may be configured to couple with DIMM 145 at slot A1. Channel A 115 may be further configured to couple with DIMM 150 at slot A2. Similar slots may exist for channel C 125, channel D 130, channel E 135, and channel F 140. In some embodiments, a channel such as channel B 120 may only include a single slot, B1, as discussed in further detail below. In some cases a single DIMM such as DIMM 145 may be configured to couple with slots of a plurality of channels, for example slots A1 and C1. As discussed herein, embodiments will be described with respect to a single channel, however in some embodiments a DIMM and/or DIMM adaptor card may be expanded across multiple channels.

A configuration wherein a channel has one slot may be referred to as 1 slot per channel (SPC). A configuration wherein a channel has two slots may be referred to as 2 SPC. Similarly, a configuration wherein a channel is populated with a single DIMM may be referred to as 1 DIMM per channel (DPC). A configuration wherein a channel is populated with two DIMMs may be referred to as 2 DPC. Based on this notation, the channel A 115 may generally be referred to as a 2 SPC configuration, and the channel B 120 may generally be referred to as a 1 SPC configuration. A system where a channel has a single slot coupled with a single DIMM may be referred to as a 1 DPC/1 SPC configuration. Similarly, a system where a channel has two slots respectively coupled with two DIMMs may be referred to as a 2 DPC/2 SPC configuration. Similarly, a system where a channel has two slots, only one of which is coupled with a DIMM, may be referred to as a 1 DPC/2 SPC configuration.

Generally, a 1 DPC/1 SPC configuration may be useful for high speed applications. For example, a DIMM in a 1 DPC/1 SPC configuration to perform at approximately 3200 MT/S or higher. Additionally, each of the DIMMs 145 and 150 in a 2 DPC/2 SPC configuration may perform at approximately 2600 MT/S or higher. For example, the DIMMs 145 and 150 in the 2 DPC/2 SPC configuration may perform at approximately 2667 MT/S or higher. This may be because a 2 DPC/2 SPC configuration may be useful for high memory capacity applications.

However, in some embodiments of a 1 DPC/2 SPC configuration, the performance of the DIMM may be negatively impacted. For example, if DIMM 145 is plugged into slot A1, and slot A2 is empty (or vice versa), then DIMM 145 may perform at lower than approximately 3200 million transfers per second (MT/S) (which may also be referred to as transactions per second). For example, in some embodiments the DIMM 145 may perform at approximately 2800 MT/S if it is plugged into slot A1 and slot A2 is empty (or vice versa). This reduced performance effect may be referred to as an empty slot effect, and may be based on resonance generated by the empty slot. Thus, in some embodiments of a 1 DPC/2 SPC configuration, adapter cards of the present disclosure, such as adaptor card 200 or 300, may be employed to facilitate removable coupling of one or more DIMMs 145 and/or 150 to a single slot such as slot B1 of channel 120, as described in further detail below. This coupling of one or more DIMMS to a single slot by way of adaptor cards 200 or 300 may reduce or eliminate the empty slot effect if and when a user desires to go to a 1 DIMM configuration from a 2 DIMM configuration, as explained in greater detail blow.

Figure 2:
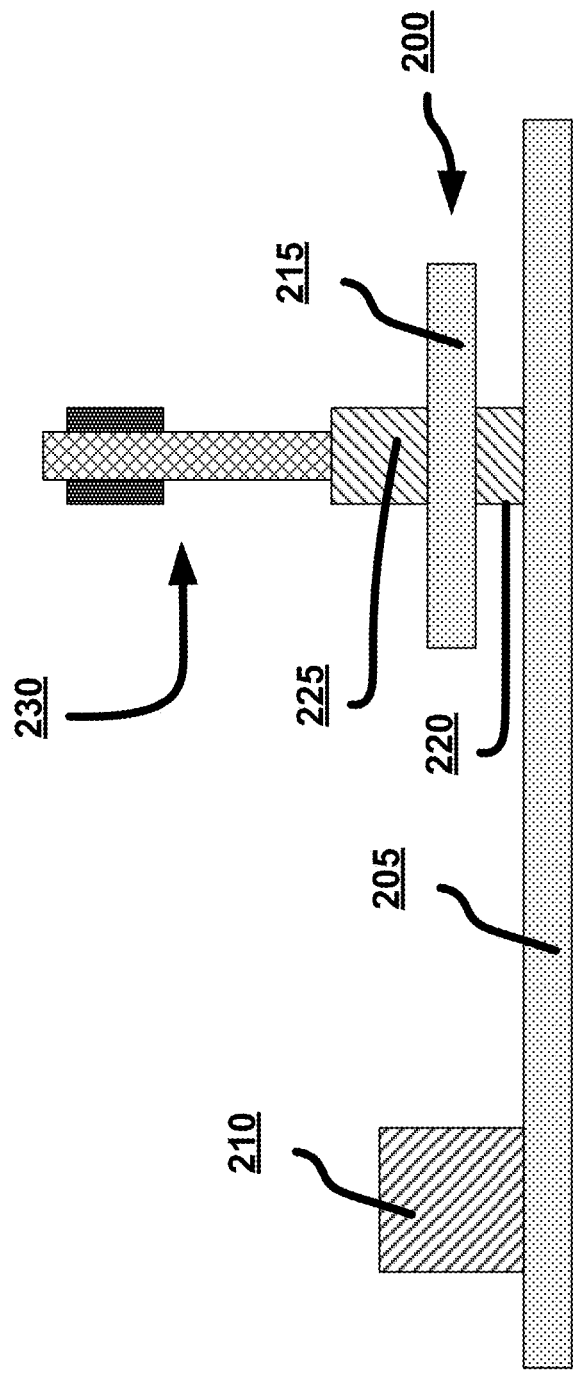
FIG. 2 illustrates an example of a DIMM adaptor card coupled with a single DIMM, in accordance with various embodiments.

FIG. 2 depicts an example of a DIMM adaptor card 200 that may be used in a system such as system 100 to overcome the empty slot effect. Specifically, FIG. 2 depicts a PCB 205 that may include a component 210, which may be a CPU that may be similar to CPUs 105 or 110. The PCB 205 may include a slot (not shown) configured to couple with the DIMM adaptor card 200. Specifically, the PCB 205 may include a slot such as slot B1 of FIG. 1.

The DIMM adaptor card 200 may include an adaptor board 215 that may have a z-height of between several dozen thousandths of an inch (a thousandth of an inch being hereinafter referred to as a mil) to more than one hundred mils. In some specific embodiments, the adaptor board 215 may have a z-height of between approximately 60 mils and 120 mils. In some embodiments, the adaptor board 215 may be a PCB daughter card, and the z-height of the adaptor board 215 may be dependent on the layer count and/or stackup of the adaptor board 215. The DIMM adaptor card 200 may further include, on a first side of the adaptor board 215, a low profile connector 220 configured to mate with a slot of the PCB 205. The low profile connector 220 may have a z-height between approximately 2 and 5 millimeters (mm). In other embodiments, the low profile connector 220 may have a z-height between approximately 1 and 3 mm, dependent on the type of connector used. The DIMM adaptor card 200 may further include a DIMM slot 225 on a second side of the DIMM adaptor board 205, wherein the DIMM slot 225 is configured to couple with a DIMM 230. As can be seen in FIG. 2, the DIMM 230 may couple with the DIMM adaptor card 200 such that the PCB 205 and the adaptor board 215 are generally horizontal and parallel with one another, and the DIMM 230 is generally vertical and perpendicular to one or both of the PCB 205 and the adaptor board 215.

Figure 3:
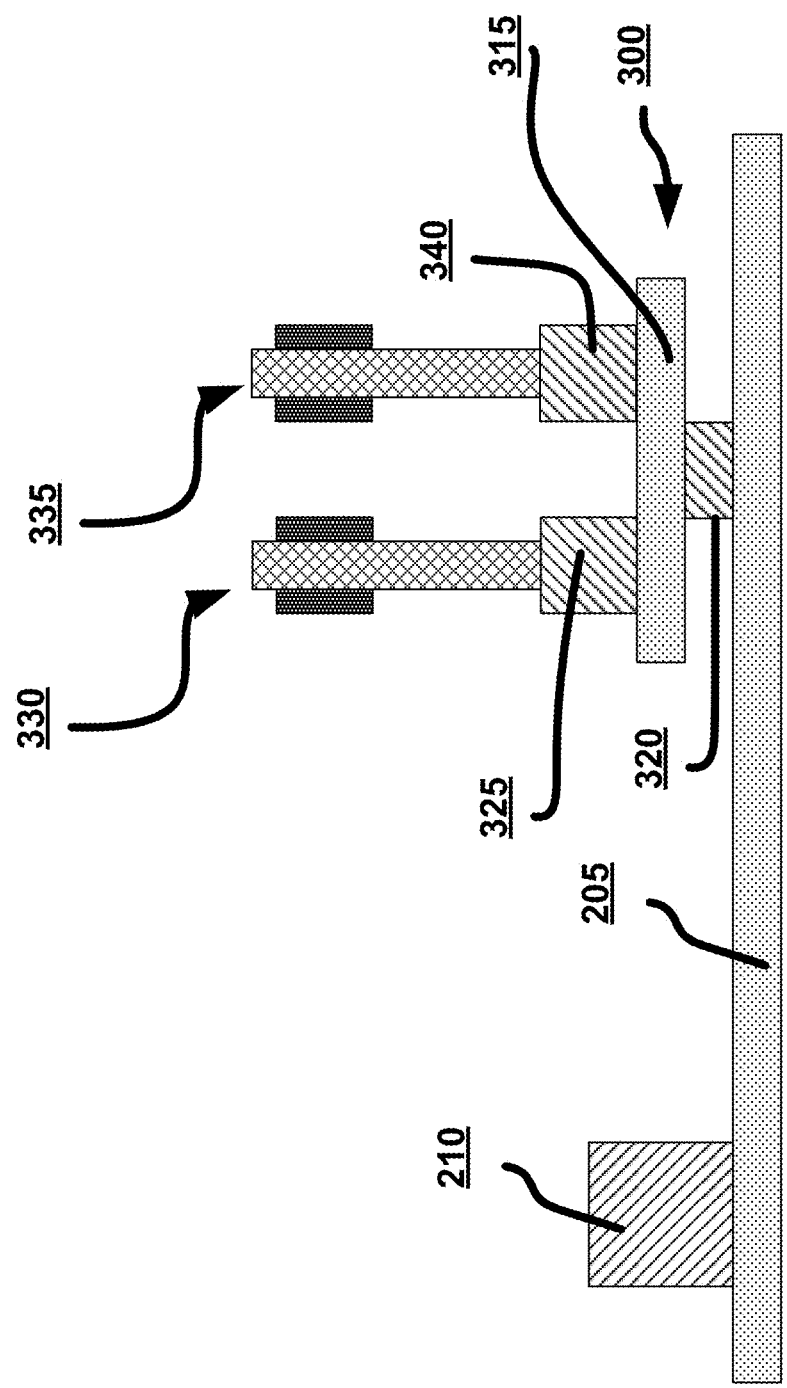
FIG. 3 illustrates an example of a DIMM adaptor card coupled with two DIMMs, in accordance with various embodiments.

FIG. 3 depicts an alternative example of a DIMM adaptor card 300 that may be used in a system such as system 100. Specifically, the DIMM adaptor card 300 may likewise be used with a system that may include a PCB 205 coupled with a component 210.

The DIMM adaptor card 300 may include an adaptor board 315 that may have a z-height similar to that of adaptor board 215, described above. The DIMM adaptor card 300 may further include, on a first side of the adaptor board 315, a low profile connector 320 that may be similar to the low profile connector 220, configured to couple adapter card 300 with a slot of PCB 205. Specifically, the low profile connector 320 may have a z-height between approximately 2 and 5 mm. In some embodiments, the low profile connector 320 may have a z-height between approximately 1 and 3 mm, dependent on the type of connector used. The DIMM adaptor card 300 may further include a first DIMM slot 325 and a second DIMM slot 340 on a second side of the adaptor board 315, which are configured to respectively couple with a first DIMM 330 and a second DIMM 335. The DIMMs 330 and 335 may be similar to, for example, DIMMs 145 and 150. As can be seen in FIG. 3, the DIMMs 330 and 335 may couple with the DIMM adaptor card 300 such that the PCB 205 and the adaptor board 315 are generally horizontal and parallel with one another, and the DIMMs 330 and 335 are generally vertical and perpendicular to one or both of the PCB 205 and the adaptor board 315. In embodiments, the DIMM adaptor card 300 may be said to have a t-shaped topology based on the single low profile connector 320 and the two DIMM slots 325 and 340.

In the embodiments depicted in FIGS. 2 and 3, the board 205 may include only a single slot per channel, for example slot B1 of FIG. 1, and the DIMM adaptor cards 200 or 300 may be inserted into the single slot of the PCB 205 for a given channel. The selection of the DIMM adaptor cards 200 or 300 may be based on whether a 1 DPC configuration, that is a high speed configuration, or a 2 DPC configuration, that is a high memory capacity configuration, as desired. In both situations, however, the PCB 205 itself may only have a single slot per channel that coupled with the DIMM adaptor cards 200 or 300 via low profile connectors 220 or 320. By switching between the adaptor cards 200 or 300, DIMMs such as DIMMs 230, 330, and/or 335 may be added to or removed from the system without generating an open/unused slot. In this manner, if only a single DIMM is desired, that is a 1 DPC/1 SPC configuration, then the single DIMM may be used without suffering reduced performance due to an empty slot effect.

More specifically, a user may be using a system such as system 100 with two DIMMs such as DIMMs 330 and 335 that are coupled with the PCB 205 via DIMM adaptor card 300. However, the user may identify that a high speed configuration, that is a 1 DPC/1 SPC configuration is desired. If the user was to simply remove a DIMM such as DIMMs 330 or 335, then the system may appear as a 1 DPC/2 SPC configuration in which the remaining DIMM may suffer significantly reduced performance due to the empty slot effect. However, if the user switches the DIMM adaptor card 300 out, and replaces it with DIMM adaptor card 200 that is coupled with DIMM 230, then the system may appear as a 1 DPC/1 SPC configuration. In the 1 DPC/1 SPC configuration, the DIMM 230 may perform at relatively high speeds such as 3200 MT/S, as described above. In this manner, the undesirable empty slot effect may be significantly reduced and/or eliminated.

Figure 4:
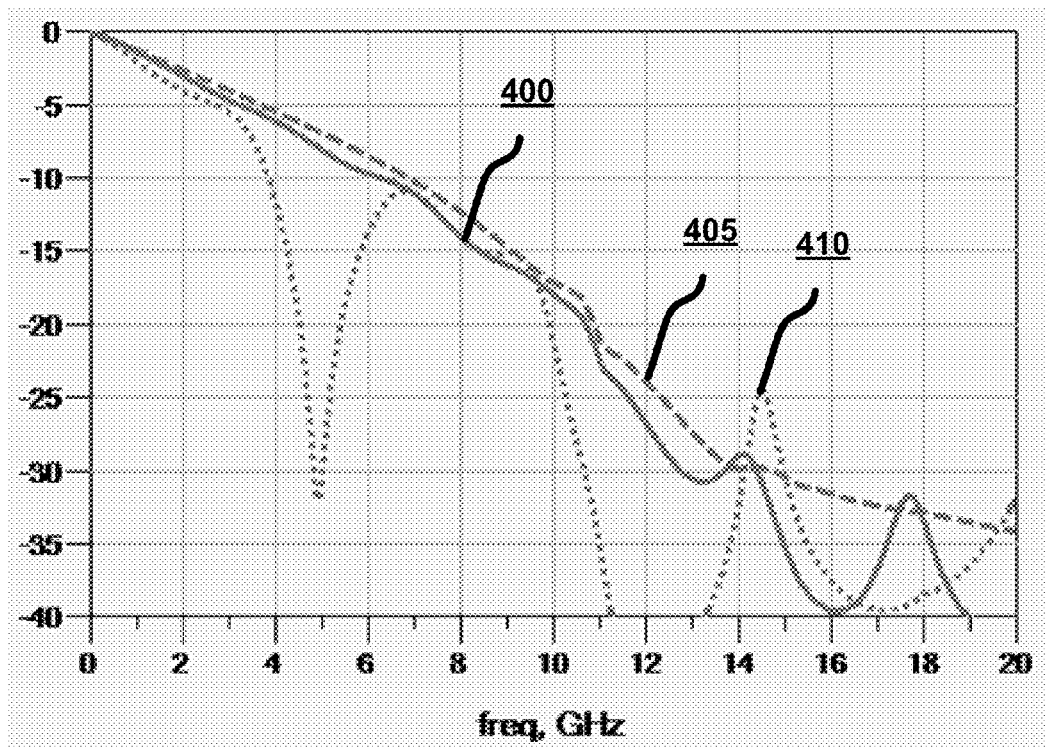
FIG. 4 illustrates an example of insertion loss in a simulated system that includes a DIMM adaptor card coupled with a single DIMM, in accordance with various embodiments.

FIG. 4 depicts an example of simulated results for a measurement of channel insertion loss. Specifically, the x axis is measured in gigahertz (GHz), and the y axis is measured in decibels (dB). Specifically, the dashed line 405 depicts a benchmark 1 DPC/1 SPC configuration for a system such as system 100 that has only a single slot per channel (e.g. channel B 120 of FIG. 1, and a single DIMM coupled with that slot. Dotted line 410 depicts insertion loss related to a 1 DPC/2 SPC configuration (e.g. DIMM 145 plugged into slot A1 and slot A2 is empty). The solid line 400 depicts insertion loss for a system such as system 100 that includes a DIMM adaptor card such as DIMM adaptor card 200, and a DIMM such as DIMM 230 plugged into the DIMM adaptor card 200.

As can be seen in FIG. 4, there may be significant insertion loss at, for example 5 GHz, 12 GHz, and 17 GHz for configurations such as a 1 DPC/2 SPC configuration as indicated by dotted line 410. As can be seen with line 400, the insertion loss may not be entirely eliminated through the use of a DIMM adaptor card such as DIMM adaptor card 200, however it may be significantly reduced and much closer to the benchmark measurements indicated by dashed line 405.

Figure 5:
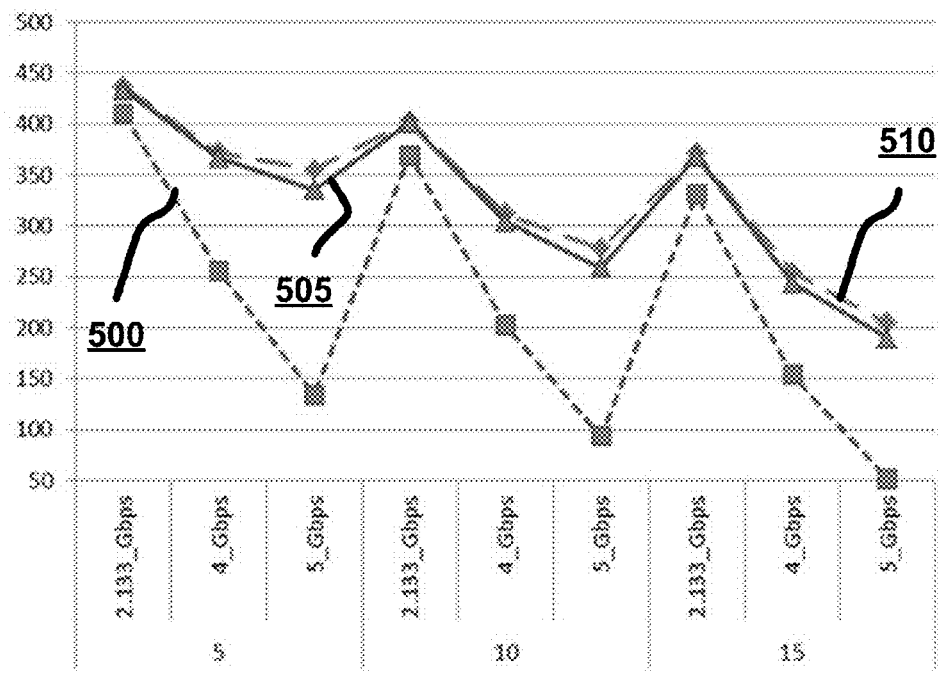
FIG. 5 illustrates an example of simulated time-domain data in a system that includes a DIMM adaptor card coupled with a single DIMM, in accordance with various embodiments.
Figure 6:
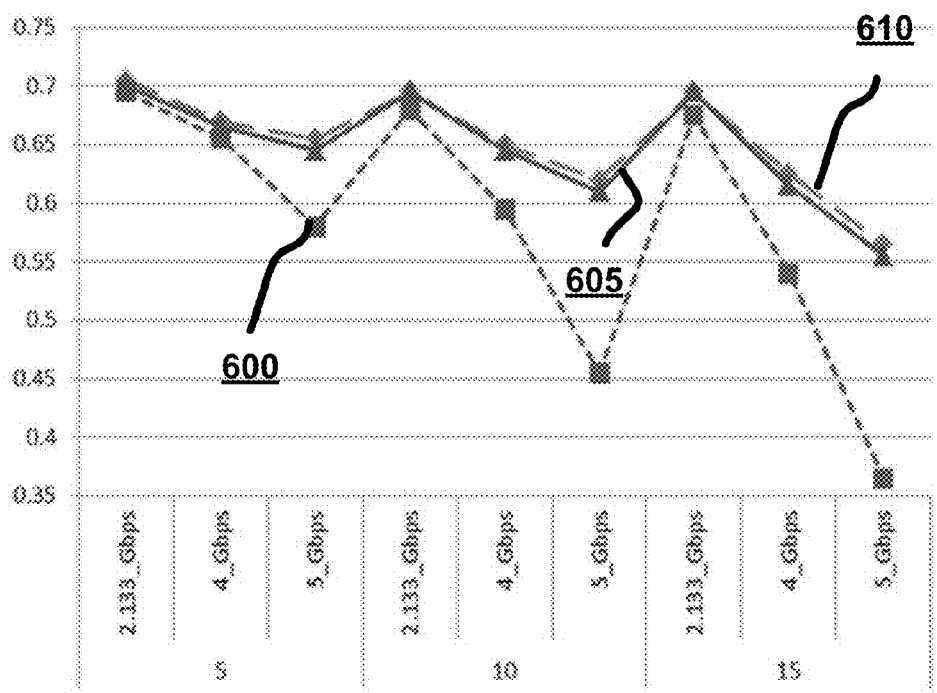
FIG. 6 illustrates an alternative example of simulated time-domain data in a system that includes a DIMM adaptor card coupled with a single DIMM, in accordance with various embodiments.

FIGS. 5 and 6 depict an example of time-domain simulation data for an eye pattern related to a system such as system 100. Specifically, FIG. 5 depicts an example of time-domain simulation data related to eye height. FIG. 6 depicts an example of time-domain simulation data related to eye width.

Specifically, in FIGS. 5 and 6 the x axis represents different data transfer rates for a 5 inch baseboard routing length, a 10 inch baseboard routing length, and a 15 inch baseboard routing length. The y axis represents eye height in millivolts (mV) in FIG. 5. The y axis in FIG. 6 represents unit intervals (UI). For example, for a DDR 4 DIMM operating at a data rate of 3200 MT/S, a UI may be approximately equal to 1/(3200 MT/S)=312.5 pico seconds. In this embodiment, the adaptor card may add approximately half an inch to the baseboard routing length. The dashed lines 510/610 depict simulated data for a baseline 1 DPC/1 SPC configuration. The dashed lines 500/600 depict simulated data for a 1 DPC/2 SPC configuration. The solid lines 505/605 depict simulated data for a system such as system 100 that includes a DIMM adaptor card such as DIMM adaptor card 200, and a DIMM such as DIMM 230 plugged into the DIMM adaptor card. As can be seen the data transfer rates increase for each of the different baseboard routing lengths, the eye height and eye width may slightly decrease for the baseline measurements 510/610. However, the eye height and eye width may more significantly decrease for a 1 DPC/2 SPC configuration. The system 100 with the DIMM adaptor 200 whose results are depicted by lines 505 and 605 may be seen to have values that are very similar to the baseline 1 DPC/1 SPC configuration, which may indicate that the use of adaptor 200 may not significantly negatively impact performance of the system 100 compared to the baseline values.

Figure 7:
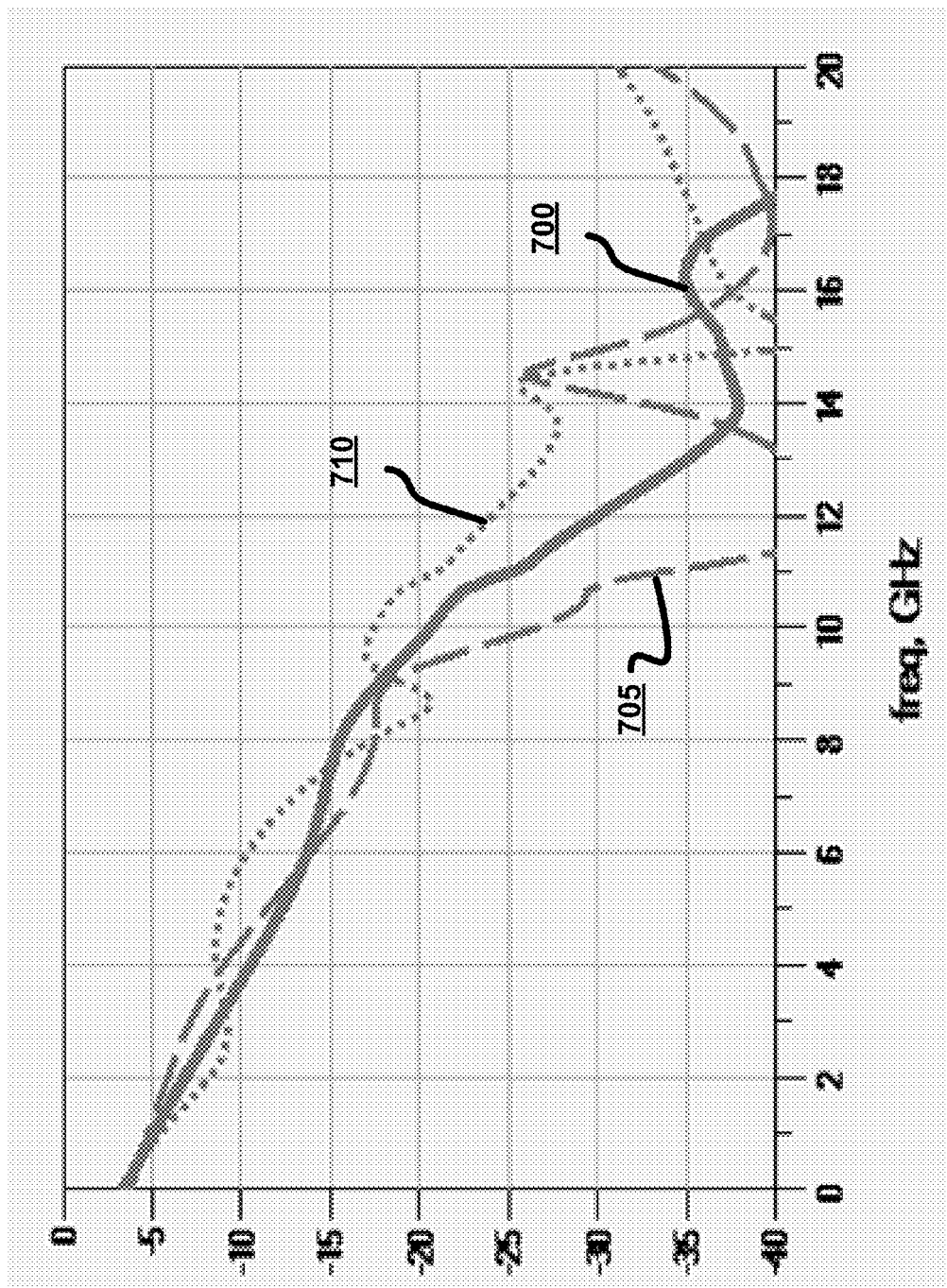
FIG. 7 illustrates an example of insertion loss in a simulated system that includes a DIMM adaptor card coupled with dual DIMMs, in accordance with various embodiments.

FIG. 7 depicts an example of simulated results for a measurement of channel insertion loss. Specifically, the x axis is measured in gigahertz (GHz), and the y axis is measured in decibels (dB). Specifically, the dashed lines 705 and 710 depicts example baseline insertion loss characteristics for a 2 DPC/2 SPC configuration for a system such as system 100 that has two slots per channel with a DIMM plugged into each of the slots. Solid line 700 depicts an example of characteristics for a system that has only a single slot per channel, and has a DIMM adaptor card such as DIMM adaptor card 300 plugged into that slot, and DIMMs 330 and 335 are plugged into the DIMM adaptor card 300. Generally, solid line 700 may be seen to indicate that the DIMM adaptor card 300 may exhibit better insertion loss characteristics than the baseline characteristics depicted by dashed lines 705 and 710.

Figure 8:
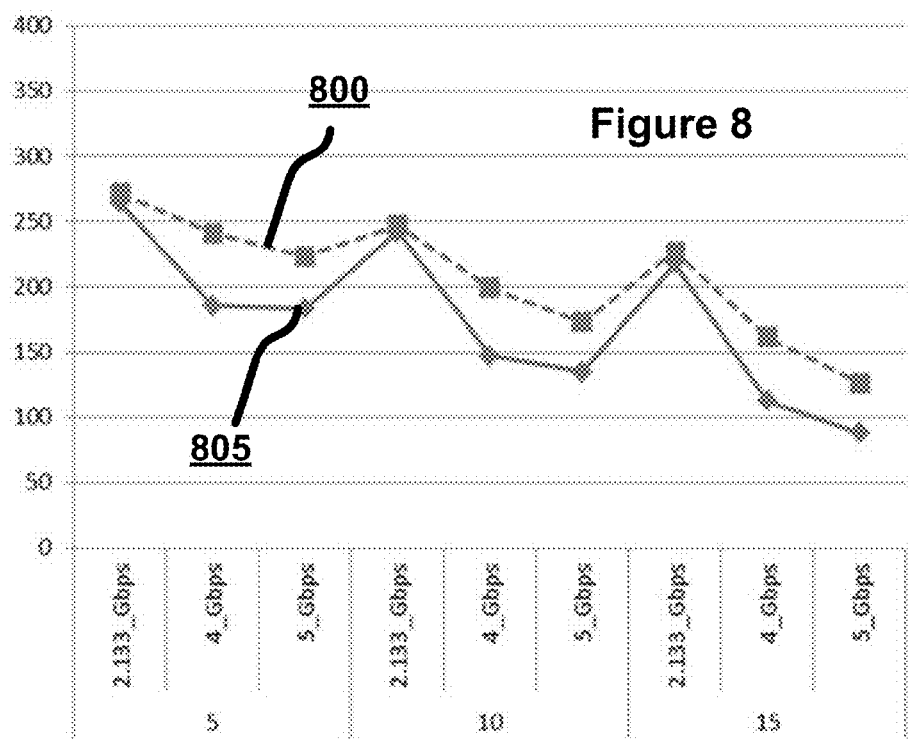
FIG. 8 illustrates an example of simulated time-domain data in a system that includes a DIMM adaptor card coupled with dual DIMMs, in accordance with various embodiments.
Figure 9:
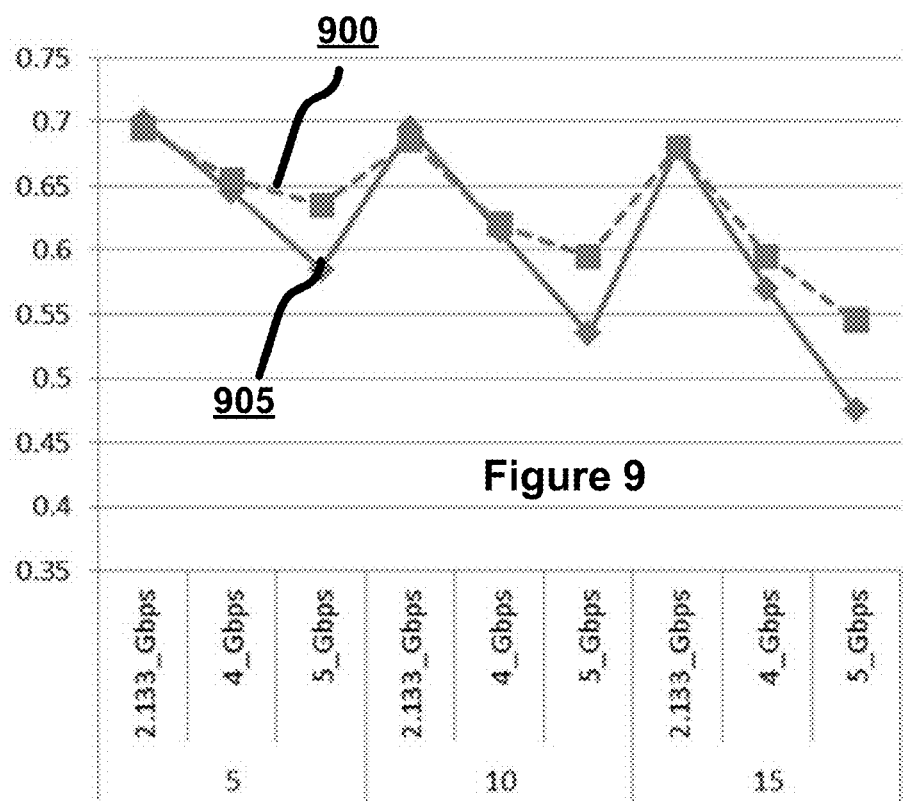
FIG. 9 illustrates an alternative example of simulated time-domain data in a system that includes a DIMM adaptor card coupled with dual DIMMs, in accordance with various embodiments.

FIGS. 8 and 9 depict an example of time-domain simulation data for an eye pattern related to a system such as system 100. Specifically, FIG. 8 depicts an example of time-domain simulation data related to eye height. FIG. 9 depicts an example of time-domain simulation data related to eye width.

Specifically, in FIGS. 8 and 9 the x axis represents different data transfer rates for a 5 inch baseboard routing length, a 10 inch baseboard routing length, and a 15 inch baseboard routing length. The y axis represents eye height in millivolts (mV) in FIG. 8. The y axis in FIG. 9 represents eye width in UI. In this embodiment, the adaptor card may add approximately half an inch to the baseboard routing length for the 2DPC topology in FIG. 3, and less than half an inch for the 1DPC topology depicted in FIG. 2. The solid lines 805 and 905 indicate baseline values for eye height and eye width, respectively, for 2 DPC/2 SPC configurations. The dashed lines 800 and 900 indicate values for eye height and eye width for systems that include only a single slot per channel, and a DIMM adaptor card such as DIMM adaptor card 300 that is coupled with DIMMs such as DIMMs 330 and 335 is coupled with the slot. As can be seen by FIGS. 8 and 9, the system that includes the DIMM adaptor card 300 may exhibit better values for both eye height and eye width that the baseline values of a 2 DPC/2 SPC configuration.

It will be understood that although DIMM adaptor cards such as DIMM adaptor cards 200 and 300, which are configured to couple with 1 DIMM and 2 DIMMs, respectively, are discussed herein, in other embodiments DIMM adaptor cards may be configured to couple with 3 DIMMs, 4 DIMMs, or some other number of DIMMs. By using the DIMM adaptor cards, a user or system manufacturer may be able to swap out the number of DIMMs in a system (either higher or lower) without introducing negative effects due to the presence of an empty slot. In other words, the user may select the DIMM adaptor card based on the number of DIMMs that are desired for the channel.

Figure 10:
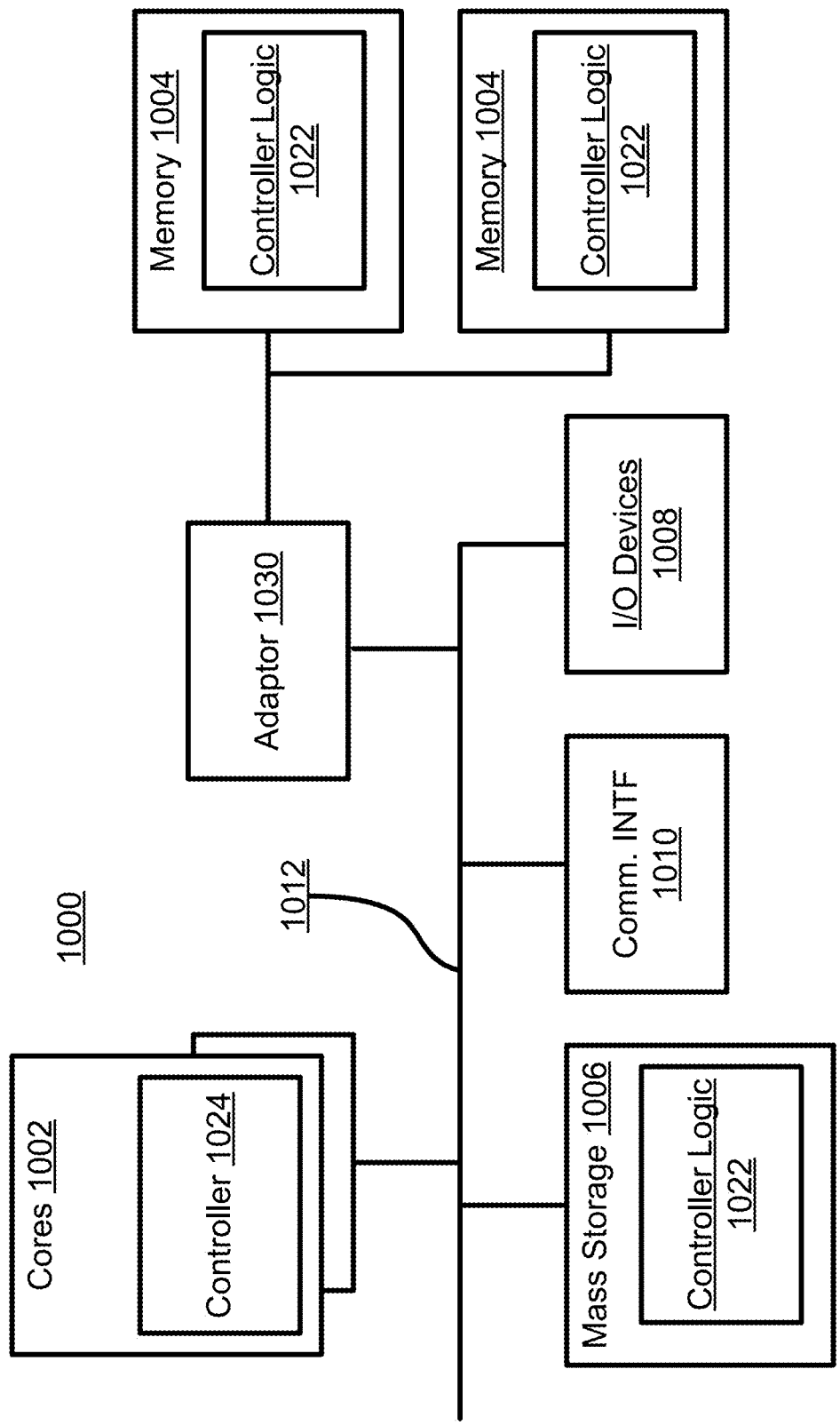
FIG. 10 illustrates an example computer system suitable for use to practice various aspects of the present disclosure, according to the disclosed embodiments.

FIG. 10 illustrates an example electronic device 1000 (e.g., a computer, a server, or some other electronic device) that may be suitable to practice selected aspects of the present disclosure. As shown, electronic device 1000 may include one or more processors or processor cores 1002. The electronic device 1000 may include one or more memories 1004, which may be DIMMs as described herein. The memories may be coupled with the other components of the electronic device by an adaptor 1030 which may be, for example, a DIMM adaptor card such as DIMM adaptor cards 200 or 300. For the purpose of this application, including the claims, the term "processors" refers to physical processors, and the terms "processor" and "processor cores" may be considered synonymous, unless the context clearly requires otherwise. Additionally, electronic device 1000 may include mass storage devices 1006 (such as diskette, hard drive, compact disc read-only memory (CD-ROM) and so forth), input/output (I/O) devices 1008 (such as display, keyboard, cursor control and so forth) and communication interfaces 1010 (such as network interface cards, modems and so forth). The elements may be coupled to each other via system bus 1012, which may represent one or more buses. In the case of multiple buses, they may be bridged by one or more bus bridges (not shown).

Each of these elements may perform its conventional functions known in the art. In particular, in some embodiments, memory 1004 and mass storage devices 1006 may be employed to store a working copy and a permanent copy of the programming instructions configured to cooperate with controllers 1024 to perform one or more processes or memory/storage transactions for the electronic device 1000. The programming instructions may be collectively referred to as controller logic 1022. The various elements may be implemented by assembler instructions supported by processor(s) 1002 or high-level languages, such as, for example, C, that can be compiled into such instructions.

The number, capability and/or capacity of the elements shown in FIG. 10 may vary, depending on whether electronic device 1000 is used as a server, a client device, or some other type of computing device. When used as a client device, the capability and/or capacity of the elements shown in FIG. 10 may vary, depending on whether the client device is a stationary or mobile device, like a smartphone, computing tablet, ultrabook or laptop. Otherwise, the constitutions of the elements shown in FIG. 10 may be known, and accordingly will not be further described. When used as a server device, the capability and/or capacity of the elements shown in FIG. 10 may also vary, depending on whether the server is a single stand-alone server or a configured rack of servers or a configured rack of server elements.

The terminology used herein is for the purpose of describing particular embodiments only and is not intended to be limiting of the disclosure. As used herein, the singular forms "a," "an" and "the" are intended to include plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Thus various example embodiments of the present disclosure have been described including, but not limited to:

Example 1 may include a dual in-line memory module (DIMM) adaptor card comprising: a first side with a slot connector to removeably couple with a slot of a printed circuit board (PCB), wherein the slot is related to a logical channel of the PCB and the PCB does not have another slot related to the logical channel; and a second side opposite the first side along a first axis, the second side with a first DIMM connector to removeably couple with a first DIMM and a second DIMM connector to removeably couple with a second DIMM, wherein the adaptor card has a t-shaped topology such that the first DIMM connector and the second DIMM connector are separated from one another along a second axis that is perpendicular to the first axis; wherein the adaptor card has a first distance along the first axis between the first side and the second side of between approximately 60 and approximately 120 thousandths of an inch (mils), and the first side is a second distance of between approximately 2 and approximately 5 millimeters from the PCB along the first axis; wherein the first DIMM and the second DIMM extend from the second side of the adaptor card along the first axis when the first DIMM and the second DIMM are coupled with the first DIMM connector and the second DIMM connector; and wherein the first DIMM or the second DIMM are to perform at least 2600 million transactions per second (MT/s) when coupled with the DIMM adaptor card, and at least 3200 MT/s when coupled directly with the slot of the PCB board.

Example 2 may include the DIMM adaptor card of example 1, wherein the DIMM adaptor further comprises a third DIMM connector to couple with a third DIMM.

Example 3 may include the DIMM adaptor card of examples 1 or 2, wherein the first axis is a z-axis, and the second distance is a z-height of the adaptor card.

Example 4 may include an apparatus comprising: a printed circuit board (PCB) that includes only one slot for a logical channel of the PCB; and a dual in-line memory module (DIMM) adaptor card coupled with the slot, wherein the DIMM adaptor card includes a first DIMM connector to couple with a first DIMM, and a second DIMM connector to couple with a second DIMM coupled with the DIMM adaptor.

Example 5 may include the apparatus of example 4, wherein the first DIMM or the second DIMM are a double data rate (DDR) DIMM.

Example 6 may include the apparatus of example 4, wherein the DIMM adaptor card has a first side that is coupled with the slot, and the first and second DIMM connectors are disposed on a second side opposite the first side.

Example 7 may include the apparatus of example 6, wherein the DIMM adaptor card has a width between the first side and the second side of between approximately 60 and approximately 120 thousandths of an inch (mils), and the first side is between approximately 2 and approximately 5 millimeters from the PCB.

Example 8 may include the apparatus of any of examples 4-7, wherein the DIMM adaptor further comprises a third DIMM connector to couple with a third DIMM.

Example 9 may include the apparatus of any of examples 4-7, wherein the DIMM adaptor card has a t-shaped topology.

Example 10 may include the apparatus of any of examples 4-7, wherein the first DIMM and the second DIMM are to respectively perform at least 2600 million transactions per second (MT/s) when coupled with the first and second DIMM connectors.

Example 11 may include the apparatus of example 10, wherein the first DIMM or the second DIMM are to perform at least 3200 MT/s when coupled directly with the slot.

Example 12 may include the apparatus of any of examples 4-7, wherein the apparatus further comprises the first and second DIMM respectively coupled with the first and second DIMM connectors, and a central processing unit (CPU) coupled with the PCB.

Example 13 may include the apparatus of any of examples 4-7, wherein the DIMM adaptor card is removeably coupled with the PCB, and with the first and second DIMM.

Example 14 may include the apparatus of any of examples 4-7, wherein the slot is the only slot of the PCB that can receive a DIMM or the DIMM adaptor card.

Example 15 may include a dual in-line memory module (DIMM) adaptor card comprising: a first side with a slot connector to removeably couple with a slot of a printed circuit board (PCB); and a second side opposite the first side, the second side with a first DIMM connector to removeably couple with a first DIMM and a second DIMM connector to removeably couple with a second DIMM.

Example 16 may include the DIMM adaptor card of example 15, wherein the first DIMM or the second DIMM are a double data rate (DDR) DIMM.

Example 17 may include the DIMM adaptor card of example 16, wherein the DIMM adaptor card has a width between the first side and the second side of between approximately 60 and approximately 120 thousandths of an inch (mils).

Example 18 may include the DIMM adaptor card of any of examples 15-17, wherein the second side of the DIMM adaptor is further to removeably with a third DIMM.

Example 19 may include the DIMM adaptor card of any of examples 15-17, wherein the DIMM adaptor card has a t-shaped topology when coupled with the PCB, the first DIMM, and the second DIMM.

Example 20 may include the DIMM adaptor card of any of examples 15-17, wherein the first DIMM and the second DIMM are to respectively perform at least 2600 million transactions per second (MT/s) when coupled with the DIMM adaptor card.

Example 21 may include the DIMM adaptor card of any of examples 15-17, wherein the first DIMM or the second DIMM are to perform at least 3200 MT/s if coupled directly with the slot of the PCB.

Example 22 may include the DIMM adaptor card of any of examples 15-17, wherein the slot is an only slot of a logical channel of the PCB.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A dual in-line memory module (DIMM) adaptor card comprising:
    a first side with a slot connector to removeably couple with a slot of a printed circuit board (PCB); and
    a second side opposite the first side, the second side with a first DIMM connector to removeably couple with a first DIMM and a second DIMM connector to removeably couple with a second DIMM;
    wherein a space between the first side of the DIMM adaptor card and the PCB after the adaptor card is coupled to the PCB has a first dimension that is less than a second dimension required to couple a DIMM to the PCB.

2. The DIMM adaptor card of claim 1, wherein the first DIMM or the second DIMM are a double data rate (DDR) DIMM.

3. The DIMM adaptor card of claim 2, wherein the DIMM adaptor card has a width between the first side and the second side of between approximately 60 and approximately 120 thousandths of an inch (mils).

4. The DIMM adaptor card of claim 1, wherein the second side of the DIMM adaptor card is further to removeably couple with a third DIMM.

5. The DIMM adaptor card of claim 1, wherein the DIMM adaptor card has a t-shaped topology when coupled with the PCB, the first DIMM, and the second DIMM.

6. The DIMM adaptor card of claim 1, wherein the first DIMM and the second DIMM are to respectively perform at least 2600 million transactions per second (MT/s) when coupled with the DIMM adaptor card.

7. The DIMM adaptor card of claim 1, wherein the first DIMM or the second DIMM are to perform at least 3200 MT/s if coupled directly with the slot of the PCB.

8. An apparatus comprising:
    a printed circuit board (PCB) that includes a slot for a logical channel of the PCB; and
    a dual in-line memory module (DIMM) adaptor card coupled with the slot at a first side of the DIMM adaptor card;
    wherein the DIMM adaptor card includes a first DIMM connector to couple with a first DIMM and a second DIMM connector to couple with a second DIMM;
    wherein the first and second DIMM connectors are disposed on a second side of the DIMM adaptor card opposite the first side; and
    wherein the DIMM adaptor card is a distance away from the PCB such that a DIMM can not be connected with the PCB at a location between the DIMM adaptor card and the PCB.

9. The apparatus of claim 8, wherein the first DIMM or the second DIMM are a double data rate (DDR) DIMM.

10. The apparatus of claim 8, wherein the DIMM adaptor card has a width between the first side and the second side of between approximately 60 and approximately 120 thousandths of an inch (mils).

11. The apparatus of claim 8, wherein the DIMM adaptor card further comprises a third DIMM connector to couple with a third DIMM.

12. The apparatus of claim 8, wherein the DIMM adaptor card has a t-shaped topology.

13. The apparatus of claim 8, wherein the apparatus further comprises the first and second DIMM respectively coupled with the first and second DIMM connectors, and a central processing unit (CPU) coupled with the PCB.

14. The apparatus of claim 8, wherein the DIMM adaptor card is removeably coupled with the PCB, and with the first and second DIMM.

\* \* \* \* \*